(12) United States Patent
Lee

(10) Patent No.: US 6,414,621 B1
(45) Date of Patent: Jul. 2, 2002

(54) ANALOG TO DIGITAL CONVERTER HAVING A PARALLEL CONVERTER AND LOGIC FOR GENERATING SERIAL DATA

(75) Inventor: Dae Hun Lee, Taeku-si (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/704,752

(22) Filed: Nov. 3, 2000

(30) Foreign Application Priority Data

Nov. 4, 1999 (KR) .............................. 99-48613

(51) Int. Cl.[7] .......................... H03M 1/00; H03M 1/36
(52) U.S. Cl. ........................................ 341/159; 341/123
(58) Field of Search ................................ 341/155, 131, 341/110, 59, 159, 123; 710/21; 360/32

(56) References Cited

U.S. PATENT DOCUMENTS

| 4,398,179 A | * | 8/1983 | Kaneko ...................... 341/131 |
| 5,198,813 A | * | 3/1993 | Isozaki ......................... 341/59 |
| 5,835,787 A | * | 11/1998 | Raffman et al. .............. 710/21 |

OTHER PUBLICATIONS

IEEE Journal Of Solid–State Circuits, vol. SC–21. No. 4. Aug. 1986.

* cited by examiner

*Primary Examiner*—Patrick Wamsley
(74) *Attorney, Agent, or Firm*—Birch, Stewart, Kolasch & Birch, LLP

(57) ABSTRACT

An analog to digital converter (ADC) circuit suitable for processing serial data at a fast rate includes a clock control block for receiving a reference strobe signal REF_STB, a reference clock signal REF_CLK, and number of bit control signals CONT_1, CONT_2. The clock control block outputs first and second internal clock signals CLK_A, and CLK_B, and a forwarding direction control signal CONT_3. The ADC circuit also includes a parallel analog to digital converter for receiving and converting analog signal into a parallel digital data synchronously with the first internal clock signal CLK_A. A parallel to serial transform logic control block then transforms the parallel digital data into serial digital data synchronously with the second internal clock signal CLK_B.

7 Claims, 4 Drawing Sheets

ANALOG TO DIGITAL CONVERTER HAVING A PARALLEL CONVERTER AND LOGIC FOR GENERATING SERIAL DATA

BACKGROUND OF THE INVENTION

1. Field of the Invention

The present invention relates to an analog to digital converter, and more particularly, to an analog to digital converter which is suitable for processing serial data at a fast rate.

2. Description of the Related Art

In general, an analog to digital converter (ADC) converts an analog signal into a digital signal over a preset time. The structure of an ADC, or a digital to analog converter (DAC), is dependent on a circuit technology used to fabricate the chip on which the ADC or DAC is located. The ADC is usually used as one function of a multi-function chip which requires serial data, rather than a parallel output. Such an ADC is required to have a high performance (e.g., a fast output data rate), and accurate data processing of the ADC is also required. However, a related art serial-processing-type ADC cannot satisfy the two requirements of fast rate data processing and high performance. Accordingly, a parallel ADC is used instead, which has the undesired requirement of an increased number of pins. Therefore, an interest in development of an ADC that permits processing of a serial data at a fast rate is ever increasing.

The related art ADC will be explained with reference to the attached drawing FIGS. 1–3. FIG. 1 illustrates a block diagram of a related art serial ADC, in which an analog signal Vin is converted into a digital signal synchronous to a reference strobe signal REF_STB and a reference clock signal REF_CLK. The digital signal is forwarded as a digital output DATA_OUT(n) in series at preset timings. One example of such a related art serial ADC may be found in "Reference refreshing cyclic analog to digital and digital to analog converters" (IEEE Journal Of Solid-State Circuits, Vol. SC-21. No. 4. Aug. 1986).

FIGS. 2 and 3 illustrate a related art algorithmic ADC and its signals, in which a strobe signal Vstb is in a high state (not shown) during a period T3 of a reference clock signal CLK_REF when CLK_REF is in a low state, and a first switch S1 is connected to an analog input terminal Vin. The voltage provided to a sample/hold unit 11 is sampled and held. The held voltage is multiplied by two in the multiplier 12, to produce voltage Va. The voltage Va from the multiplier 12 is compared to a reference voltage $V_{REF}$ in a high period T3 of the reference clock signal CLK_REF, to determine a data $V_{OUT}$. $V_{OUT}$ is provided in series during a low period T4 of the reference clock signal CLK_REF. In this instance, the provided signal $V_{OUT}$ becomes the most significant bit (MSB) of the output data DATA_OUT(8), which is $D_7$ if the output data has 8 bits.

In the meantime, the strobe signal Vstb is in a high state only in a low portion of the T3 period of the reference clock signal CLK_REF, and is held in a low state (not shown) until period T11 of the reference clock signal CLK_REF. That is, the strobe signal Vstb is in the low state until the strobe signal Vstb transitions to high (not shown) in a low period T12 of CLK_REF, because a reference strobe signal REF_STB transitions to high in T10. Then, when the MSB is fixed in period T4 of the reference clock signal CLK_REF, a voltage provided from a second switch S2 is determined by the MSB, $V_{OUT}$. Then, the voltage from the second switch S2 becomes Va−Vs2, and is forwarded during a low period T5 of CLK_REF through the sample/hold unit 11, the multiplier 12, and the comparator 13, thereby fixing the next bit value $D_6$ of the DATA_OUT. This process is continued over successive clock cycles until all bits ($D_{n-1}$ to $D_0$) are generated.

Referring to FIG. 3, digital outputs DATA_OUT(8) are provided in series at preset timings synchronous to the reference strobe signal REF_STB and the clock signal CLK_REF by repeating the aforementioned process. Clocks each having a rising edge are generated as many times as the number of desired bits of the serial data during outputting the serial data DATA_OUT(8), to provide an external clock signal CLK_OUT. However, if the analog signal Vin provided in response to the strobe signal Vstb contains an error caused as the analog signal Vin passes through the sample/hold unit and the multiplier (i.e., the analog signal Vin has a difference from the Va), this error or difference is Voffset in the MSB. Then, the next bit's voltage is multiplied by two in the multiplier, and the resulting error in the next-most significant bit is {(Voffset×2)+Voffset}. Thus, the inherent error Voffset in the related art ADC increases by $2^n$ as a number of bits "n" increases, and the related art algorithmic ADC cannot provide accurate digital data.

SUMMARY OF THE INVENTION

Accordingly, the present invention is directed to an analog to digital converter that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an analog to digital converter circuit includes a clock control block for providing first and second internal clock signals; a parallel analog to digital converter for receiving and converting an analog signal into parallel digital data synchronously with the first internal clock signal; and a parallel to serial transform logic control block for transforming the parallel digital data into serial digital data synchronously with the second internal clock signal.

In accordance with another aspect of the invention, a method for converting an analog input signal into a serially output digital signal includes converting the analog input signal into parallel digital data synchronously with a first clock signal; and transforming the parallel digital data into the serially output digital signal synchronously with a second clock signal.

An advantage of the present invention is providing an analog to digital converter which increases the accuracy of the output data, and which is suitable for providing serial data at a fast rate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to embodiments of the present invention, examples of which are illustrated in the accompanying drawings.

Figure 1:
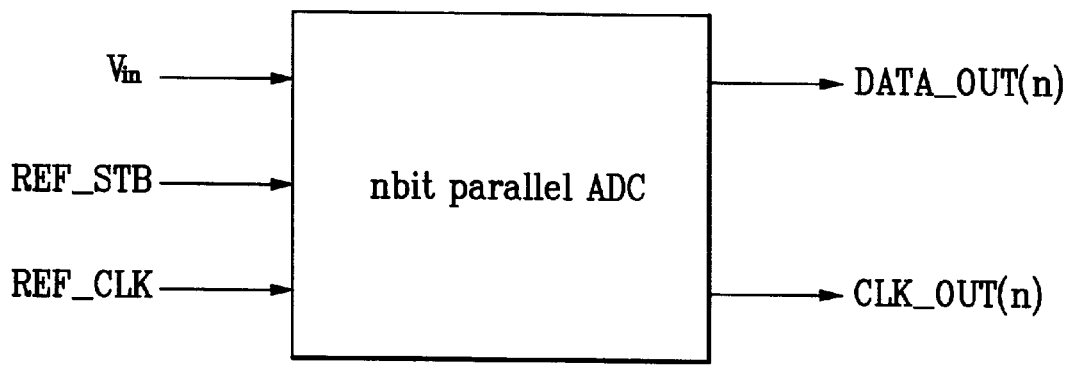
FIG. 1 illustrates a block diagram of a related art serial ADC.
Figure 2:
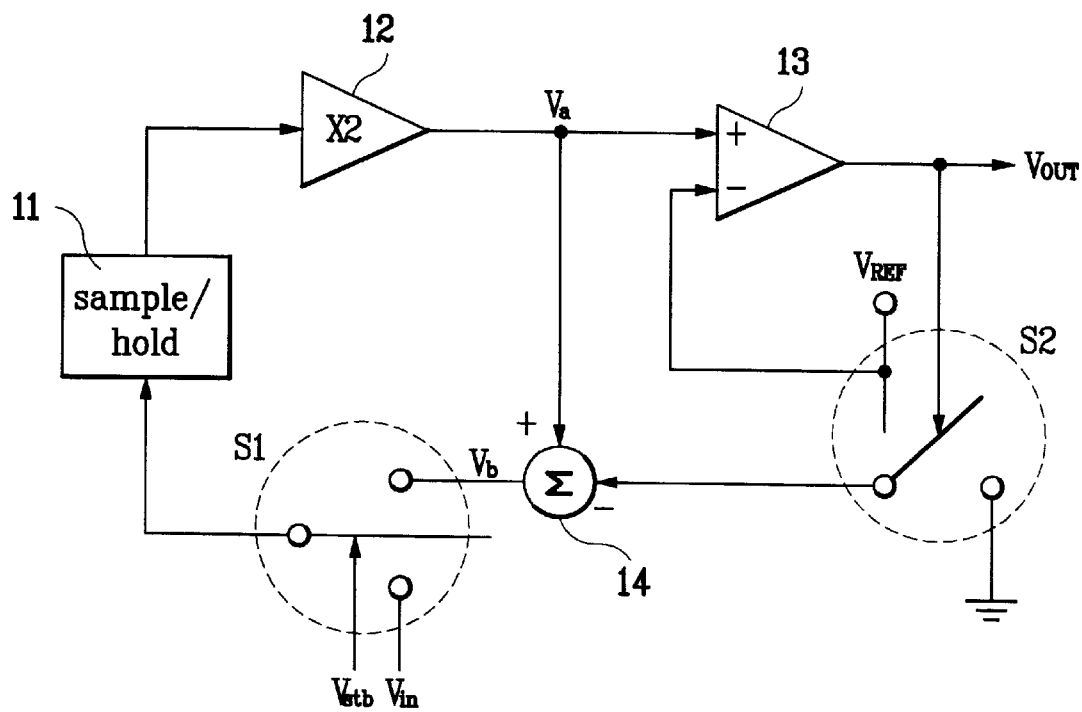
FIG. 2 illustrates a circuit of a related art algorithmic ADC.
Figure 3:
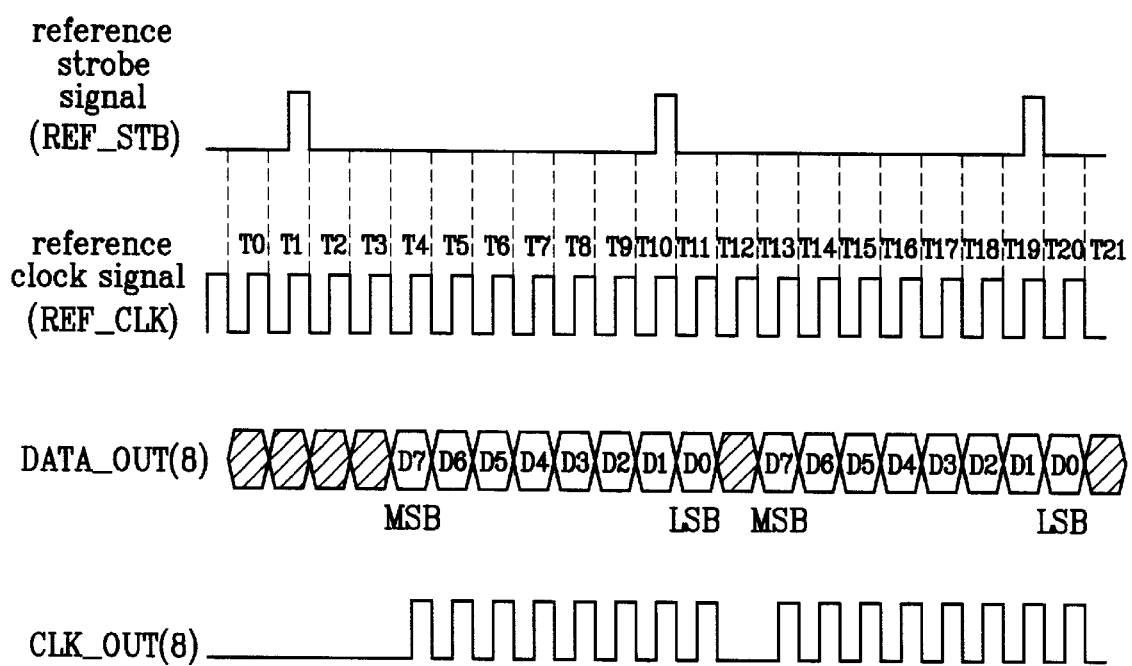
FIG. 3 illustrates an output timing diagram of 8 bit serial digital data from the related art algorithmic ADC shown in FIG. 2.
Figure 4:
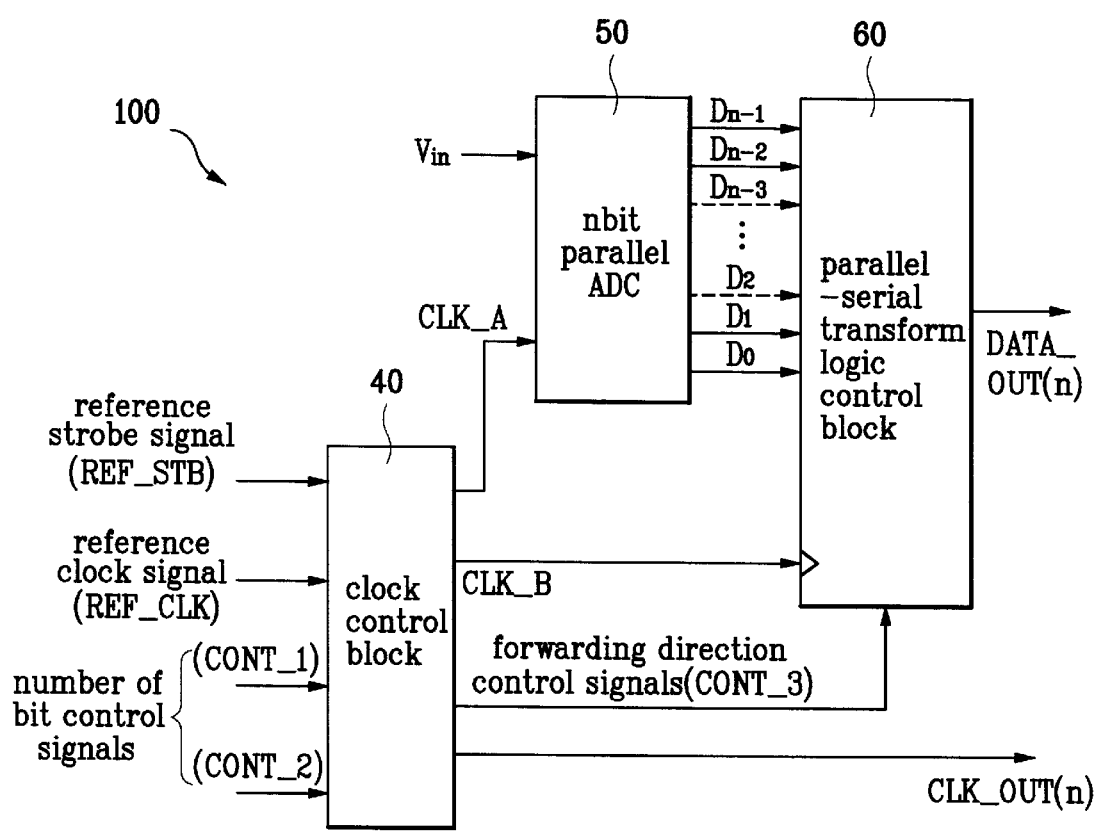
FIG. 4 illustrates a block diagram of an ADC in accordance with an embodiment of the present invention; and, FIG. 5 illustrates an output timing diagram of 8 bit serial digital data from the ADC shown in FIG. 4.

Referring to FIG. 4, the ADC 100 therein includes a clock control block 40 for receiving a reference strobe signal REF_STB, a reference clock signal REF_CLK, and number of bit control signals CONT_1, CONT_2. The clock control block 40 provides first and second internal clock signals CLK_A, and CLK_B, and a forwarding direction control signal CONT_3. The ADC 100 also includes a parallel analog to digital converter 50 for receiving and converting an analog signal Vin into parallel digital data $D_{n-1}$ to $D_0$ synchronously with the first internal clock signal CLK_A, and a parallel to serial transform logic control block 60 for transforming the parallel digital data $D_{n-1}$ to $D_0$ into serial digital data synchronously with the second internal clock signal CLK_B.

The operation of the ADC 100 in accordance with an embodiment of the present invention will be explained. The ADC 100 receives one analog signal Vin synchronously with a reference strobe signal REF_STB, and provides a digital data DATA_OUT in series for as many bits as desired before repeating the same process in response to the next reference strobe signal REF_STB.

Figure 5:
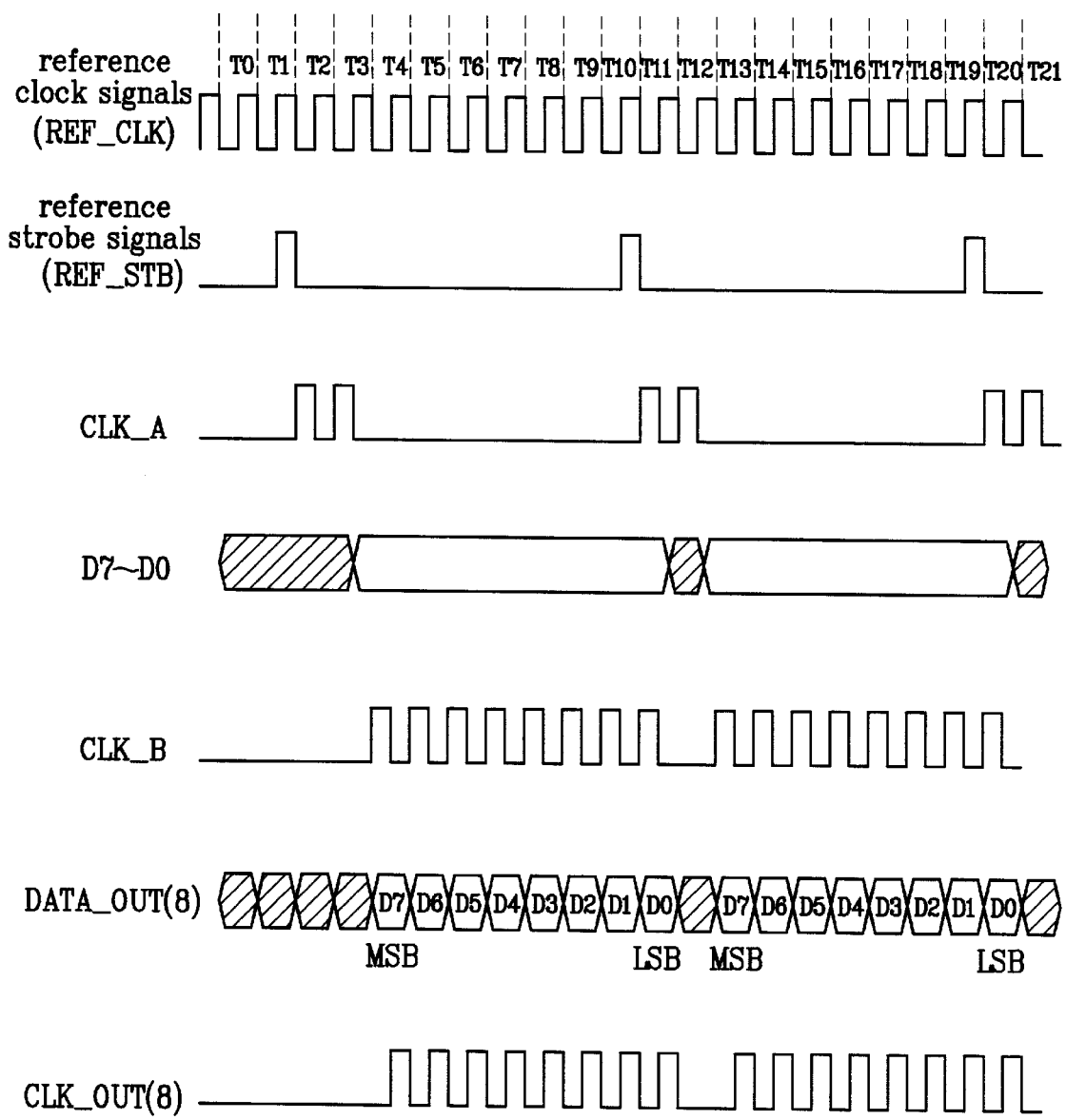

Referring to FIG. 5, the clock control block 40 uses a reference clock signal REF_CLK and a reference strobe signal REF_STB to produce a first internal clock signal CLK_A and a second internal clock signal CLK_B. The first internal clock signal CLK_A is provided with reference to a high period of a time point T1 of REF_CLK when the reference strobe signal REF_STB becomes high. Then, the parallel analog to digital converter 50 receives the analog signal Vin synchronously with the first internal clock signal CLK_A, and converts the analog signal Vin into digital data $D_{n-1}\sim D_0$ having a desired number of bits n. The digital data, which is in parallel, is then sustained until a new analog signal Vin is received as the next reference strobe signal REF_STB transitions to a high level. Then, in T2~T3 periods of the reference clock signal $REF_n\_CLK$, the parallel ADC 50 loads the digital data $D_{n-1}\sim D_0$ in parallel to the control block 60. That is, the digital data $D_{n-1}\sim D_0$ is transmitted to the parallel-serial transform control block 60 in parallel by one time clocking of the first internal clock signal CLK_A.

Then, the digital data transmitted in parallel to the control block 60 is output in series at a rising edge of the second internal clock signal CLK_B. The parallel-serial transform control block 60 uses a logic including a shift register with which bi-directional shift and parallel load/serial out are available in transforming the digital data $D_{n-1}\sim D_0$ from parallel to series synchronous to the second internal clock signal CLK_B.

The number of bit control signals CONT_1 and CONT_2 provided to the clock control block 40 are used in adjusting a rising edge of the second internal clock signal CLK_B, and for fixing a desired number of output bits. That is, if the second internal clock signal CLK_B has eight rising edges, the digital data provided synchronously with the second internal clock signal CLK_B has eight bits. Similarly, if the second internal clock signal CLK_B has six rising edges, the digital data provided synchronously with the second internal clock signal CLK_B has six bits. Depending on the second internal clock signal CLK_B, the number of bits output by the control block 60 may be equal to or less than the number of bits n output by the parallel ADC 50.

The forwarding direction control signal CONT_3 from the clock control block 40 is used in forwarding the serial data in a form starting from MSB to least significant bit (LSB), or from LSB to MSB. The clock control block 40 also outputs an output clock CLK_OUT with a rising edge which is synchronous with the serial data.

As has been explained, the analog-to digital converter of the present invention has the following advantages. First, the reduction of offset voltage accumulation errors improves the accuracy of the device. Second, the number of bits and the direction of output of the serial data may be easily controlled. Third, the reduction to a minimum of the operational time of the analog circuit in the parallel ADC 50 may reduce power consumption.

It will be apparent to those skilled in the art that various modifications and variations can be made in the analog to digital converter of the present invention without departing from the spirit or scope of the invention. For example, those skilled in the art will appreciate that a number of circuit designs are possible for control block 40, in part dictated by the timing and logical states chosen for the bit control signals CONT_1 and CONT_2. It should also be realized that the timing of the signals in FIG. 5 are merely one embodiment, and should not strictly limit the invention. For example, the first internal clock signal CLK_A may be generated in numerous ways, and should precede the second internal clock signal CLK_B. However, there is no requirement that CLK_B follow CLK_A by one cycle of the reference clock signal REF_CLK. Further, the forwarding direction control signal CONT_3 should precede the second internal clock signal CLK_B. However, CONT_3 may also precede, for example, CLK_A. Hence, those skilled in the art will appreciate that the control and clock signals may be varied according to design choices and tradeoffs, as long as they perform the functions outlined above. Thus, it is intended that the present invention cover the modifications and variations of this invention provided they come within the scope of the appended claims and their equivalents.

What is claimed is:

1. An analog to digital converter (ADC) circuit, comprising:
   a clock control block for providing first and second internal clock signals;
   a parallel analog to digital converter for receiving and converting an analog signal into parallel digital data synchronously with the first internal clock signal; and
   a parallel to serial transform logic control block for transforming the parallel digital data into serial digital data synchronously with the second internal clock signal, wherein the clock control block adjusts a number of rising edges of the second internal clock signal in response to a number of bit control signals, the number of rising edges of the second internal clock signal being adjusted to be identical to a desired number of bits of serial digital data, the clock control block adjusting an output direction of the serial digital data from most significant to least significant bits or from least significant to most significant bits by providing a forwarding direction control signal to the parallel to serial transform logic control block.

2. The ADC circuit in claim 1, wherein the clock control block provides the first and second internal clock signals in response to a reference strobe signal and a reference clock signal.

3. The ADC circuit in claim 1, wherein the clock control block provides the first internal clock signal synchronously with a high state of a reference strobe signal.

4. The ADC circuit in claim 1, wherein the parallel ADC transforms the analog signal into parallel digital data by one clocking of the first internal clock signal.

5. The ADC circuit in claim 1, wherein the parallel to serial transform logic control block provides a serial digital data at a rising edge of the second internal clock signal.

6. The ADC circuit in claim 1, wherein the parallel to serial transform logic control block uses logic including a shift register in providing the serial data.

7. An method for converting an analog input signal into a serially output digital signal, comprising:

converting the analog input signal into parallel digital data synchronously with a first clock signal generating a plurality of signals including the first and second clock signals from a strobe signal, a reference clock signal, and a plurality of control signals including, a forwarding direction control signal to control a bit ordering of the serially output digital signal, the plurality of control signals determining a number of bits of the serially output digital signal; and transforming the parallel digital data into the serially output digital signal synchronously with a second clock signal; and wherein the transforming step includes, loading the parallel digital data into a register, and shifting the parallel digital data in the register by bits to serially output successive bits of the serially output digital signal.

* * * * *